US009231414B2

(12) United States Patent
Viancino et al.

(10) Patent No.: US 9,231,414 B2
(45) Date of Patent: Jan. 5, 2016

(54) DEVICE AND METHOD TO DISCHARGE A CAPACITOR FOR USE IN THE ELECTRIC POWER SYSTEM OF AN ELECTRIC DRIVE VEHICLE

(75) Inventors: Riccardo Viancino, Turin (IT); Fabio Bernardi, Osasco (IT); Giovanni Giuffre', Turin (IT)

(73) Assignee: MAGNETI MARELLI S.P.A., Corbetta (IT)

( * ) Notice: Subject to any disclaimer, the term of this patent is extended or adjusted under 35 U.S.C. 154(b) by 548 days.

(21) Appl. No.: 13/572,789

(22) Filed: Aug. 13, 2012

(65) Prior Publication Data
US 2013/0207619 A1 Aug. 15, 2013

(30) Foreign Application Priority Data

Aug. 12, 2011 (IT) .............................. TO2011A0769

(51) Int. Cl.
H02J 7/00 (2006.01)
H03K 17/16 (2006.01)
H03K 17/785 (2006.01)
B60L 3/00 (2006.01)
B60L 3/04 (2006.01)
H02M 1/34 (2007.01)
H02M 1/32 (2007.01)

(52) U.S. Cl.
CPC ................. H02J 7/00 (2013.01); B60L 3/0046 (2013.01); B60L 3/04 (2013.01); H03K 17/163 (2013.01); H03K 17/785 (2013.01); H02J 7/0026 (2013.01); H02J 2007/004 (2013.01); H02M 2001/322 (2013.01); H02M 2001/344 (2013.01)

(58) Field of Classification Search
CPC .......................... H02J 2007/004; H02J 7/0026

USPC .................. 320/134–136, 166–167; 307/10.1
See application file for complete search history.

(56) References Cited

U.S. PATENT DOCUMENTS 3,670,178 A 6/1972 Atkins
4,354,118 A * 10/1982 Spencer .......................... 307/66
5,523,665 A * 6/1996 Deaver .......................... 320/166

(Continued)

FOREIGN PATENT DOCUMENTS

EP 1596496 A 11/2008

OTHER PUBLICATIONS

Aug. 1, 2012 Search Report for Italian Patent App. No. IT TO20110769.

Primary Examiner — Stacy Whitmore
(74) Attorney, Agent, or Firm — Howard & Howard Attorneys PLLC

(57) ABSTRACT

A discharge device and method actively discharge a main capacitor in an electric-power system of an electric-drive vehicle. The discharge device comprises a discharge branch of a circuit that is connected in parallel to the main capacitor and includes a discharge transistor that is biased to "conduction" mode when the main capacitor is required to be discharged. A control device is connected to a "gate/base" terminal of the discharge transistor and commands the discharge transistor, biasing the discharge resistor to "conduction" mode when the main capacitor is required to be discharged. The control device includes a safety capacitor that is interposed between the "gate/base" terminal and a power supply and charges when the discharge transistor is in the "conduction" mode, causing a progressive decrease of current at the "gate/base" terminal, until the discharge transistor is biased to the "non-conductive" state.

8 Claims, 4 Drawing Sheets

(56) References Cited

U.S. PATENT DOCUMENTS

| | | | | |
|---|---|---|---|---|
| 5,721,484 | A * | 2/1998 | Ngo et al. | 323/313 |
| 6,094,087 | A | 7/2000 | He et al. | |
| 6,617,830 | B2 * | 9/2003 | Nozu et al. | 320/166 |
| 6,639,777 | B1 * | 10/2003 | Congdon | 361/94 |
| 7,157,884 | B2 * | 1/2007 | Hacsi | 320/167 |
| 7,427,851 | B2 * | 9/2008 | Takemoto et al. | 320/166 |
| 7,579,709 | B2 * | 8/2009 | Goetz et al. | 307/10.1 |
| 8,115,457 | B2 * | 2/2012 | Balakrishnan et al. | 320/166 |
| 8,369,051 | B2 * | 2/2013 | Skatulla | 361/18 |
| 8,436,590 | B2 * | 5/2013 | Funaba et al. | 320/166 |
| 8,612,073 | B2 * | 12/2013 | Fuji et al. | 701/22 |
| 8,624,562 | B2 * | 1/2014 | Balakrishnan et al. | 320/166 |
| 8,686,694 | B2 * | 4/2014 | Funaba et al. | 320/166 |
| 8,963,503 | B2 * | 2/2015 | Wiederhold et al. | 320/134 |
| 2008/0190680 | A1 * | 8/2008 | Kaneko et al. | 180/170 |
| 2010/0090628 | A1 * | 4/2010 | Endo et al. | 318/400.3 |
| 2010/0213904 | A1 * | 8/2010 | Yamada | 320/166 |
| 2010/0214055 | A1 | 8/2010 | Fuji et al. | |
| 2011/0031939 | A1 * | 2/2011 | Funaba et al. | 320/166 |
| 2011/0057627 | A1 * | 3/2011 | Kuehner | 320/166 |
| 2011/0095725 | A1 * | 4/2011 | Troxel et al. | 320/118 |
| 2012/0268078 | A1 * | 10/2012 | Kajouke et al. | 320/166 |
| 2012/0268079 | A1 * | 10/2012 | Nakamura | H02J 7/0031 320/166 |
| 2013/0049706 | A1 * | 2/2013 | Huang et al. | 320/166 |
| 2013/0200692 | A1 * | 8/2013 | Viancino et al. | 307/10.1 |
| 2013/0207458 | A1 * | 8/2013 | Viancino et al. | 307/10.1 |
| 2013/0207619 | A1 * | 8/2013 | Viancino et al. | 320/166 |
| 2014/0062421 | A1 * | 3/2014 | Jeong | 320/166 |
| 2014/0125293 | A1 * | 5/2014 | Kainuma et al. | 320/166 |

* cited by examiner

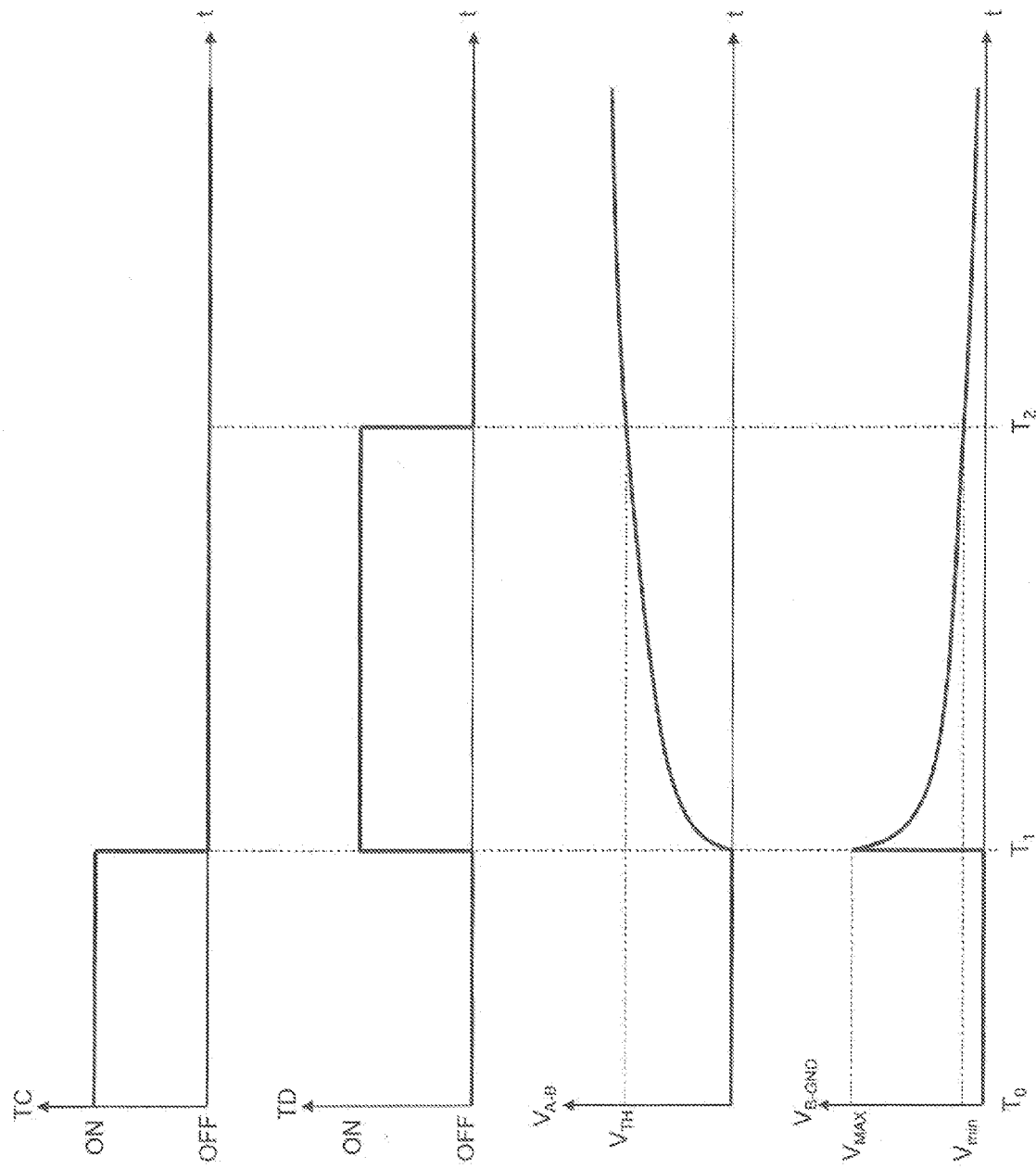

DEVICE AND METHOD TO DISCHARGE A CAPACITOR FOR USE IN THE ELECTRIC POWER SYSTEM OF AN ELECTRIC DRIVE VEHICLE

REFERENCE TO RELATED APPLICATION

This application claims benefit of the filing date of and priority to Italian Patent Application TO2011A 000769 filed on Aug. 12, 2011.

BACKGROUND OF INVENTION

1. Field of Invention

The invention relates to, in general, a discharge device and, in particular, such a device and discharge method to actively discharge a capacitor in an electric-power system of an electric-drive vehicle ["electric-drive vehicle" meaning either a vehicle with electric drive only (i.e., free from other types of mechanical-energy sources) or hybrid vehicle provided with electric drive and thermal drive].

2. Description of Related Art

Electric drive combined with traditional thermal drive for making hybrid drive is becoming increasingly more popular in road vehicles. Electric drive includes using a three-phase (typically, synchronous and of the "permanent magnet" type), reversible rotating electric machine (i.e., capable of working either as an electric motor by drawing electricity and generating a mechanical drive torque or electric generator by drawing mechanical energy and generating electricity) that, on one side, is mechanically connected or connectable to the drive wheels and, on the other side, electrically connected to an electronic power converter that exchanges electricity with a storage system consisting of electrochemical cells working at high-voltage, (of the order of 400-600 volts). A filter capacitor is present immediately downstream of the storage system. The filter capacitor is installed in the electronic power converter and connected in parallel to the terminals of the storage system and has a high capacity and the function of absorbing/supplying high-frequency electricity. In other words, the storage system supplies/absorbs the "average value" of the exchanged electricity while the filter capacitor supplies/absorbs the pulse variations of the exchanged electricity (this extends the life of the electrochemical cells of the storage system, which rapidly decay when they must exchange impulsive energy).

When needed (e.g., whenever the vehicle is turned off at the end of traveling by the starter key or is case of maintenance intervention or accidents), the storage system is galvanically isolated from the rest of the electric circuit by an isolating switch to ensure the disconnection of electricity from the electric circuit. However, the filter capacitor is arranged downstream of the insulating switch of the storage system, and, by remaining charged, it maintains the electric system live for a very long time. It is, therefore, necessary to discharge the filter capacitor whenever the isolating switch of the storage system is opened. How to discharge a capacitor in a passive manner (i.e., by a discharge resistor that is permanently connected in parallel to the capacitor) or active manner (i.e., by biasing a discharge resistor to "conduction" mode to create a discharge branch in parallel to the capacitor by which the capacitor charge is dissipated) is known.

The passive discharge system is highly safe because it always works (at least until mechanical integrity of the system is ensured), but it requires a very long time (of the order of several minutes) to take the residual voltage of the capacitor to safe levels and provides a permanent energy dissipation by "Joule effect." On the other hand, the active discharge system may rapidly discharge the capacitor (in a few seconds) and only dissipates energy when it is used (therefore, it has an absolutely negligible energy dissipation). But, on the other hand, it may not be activated in case of malfunction of the control system that must activate the discharge transistor.

Thus, it is the object of the invention to provide a discharge device and method to actively discharge a capacitor used in an electric-power system of an electric-drive vehicle. More specifically, it is the object of the invention to provide such a discharge device and method that are free from the above-described drawbacks while being easy and cost-effective to be implemented.

SUMMARY OF INVENTION

The invention overcomes the drawbacks in the related art in a discharge device that actively discharges a main capacitor in an electric-power system of an electric-drive vehicle. The discharge device comprises a discharge branch of a circuit that is connected in parallel to the main capacitor and includes a discharge transistor that is biased to "conduction" mode when the main capacitor is required to be discharged. A control device is connected to a "gate/base" terminal of the discharge transistor and commands the discharge transistor, biasing the discharge resistor to "conduction" mode when the main capacitor is required to be discharged. The control device includes a safety capacitor that is interposed between the "gate/base" terminal and a power supply and charges when the discharge transistor is in the "conduction" mode, causing a progressive decrease of current at the "gate/base" terminal until the discharge transistor is biased to the "non-conductive" state.

The invention overcomes the drawbacks in the related art in also a discharge method for active discharge of a main capacitor in an electric-power system of an electric-drive vehicle. The method comprises a step of biasing, when the main capacitor is required to be discharged, a discharge transistor to "conduction" mode to create a discharge branch in a circuit through which energy accumulated in the main capacitor is discharged. The method comprises also a step of charging, when the discharge transistor is in the "conduction" mode, a safety capacitor that is interposed between a "gate/base" terminal of the discharge transistor and a power supply to cause a progressive decrease of current at the "gate/base" terminal until the discharge transistor is biased to a "non-conductive" state.

The discharge device and method of the invention actively discharge a capacitor used in an electric-power system of an electric-drive vehicle. More specifically, the discharge device and method of the invention axe free from the above-described drawbacks while being easy and cost-effective to be implemented.

Other objects, features, and advantages of the discharge device and method of the invention are readily appreciated as the discharge device and method become more understood while the subsequent detailed description of at least one embodiment of the discharge device and method is read taken. In conjunction with the accompanying drawing thereof.

BRIEF DESCRIPTION OF EACH FIGURE OF DRAWING

FIG. 4 charts time evolution of magnitudes of the embodiment of the discharge device illustrated in FIG. 1 when activating the capacitor discharge.

DETAILED DESCRIPTION OF EMBODIMENTS OF INVENTION

Figure 1:
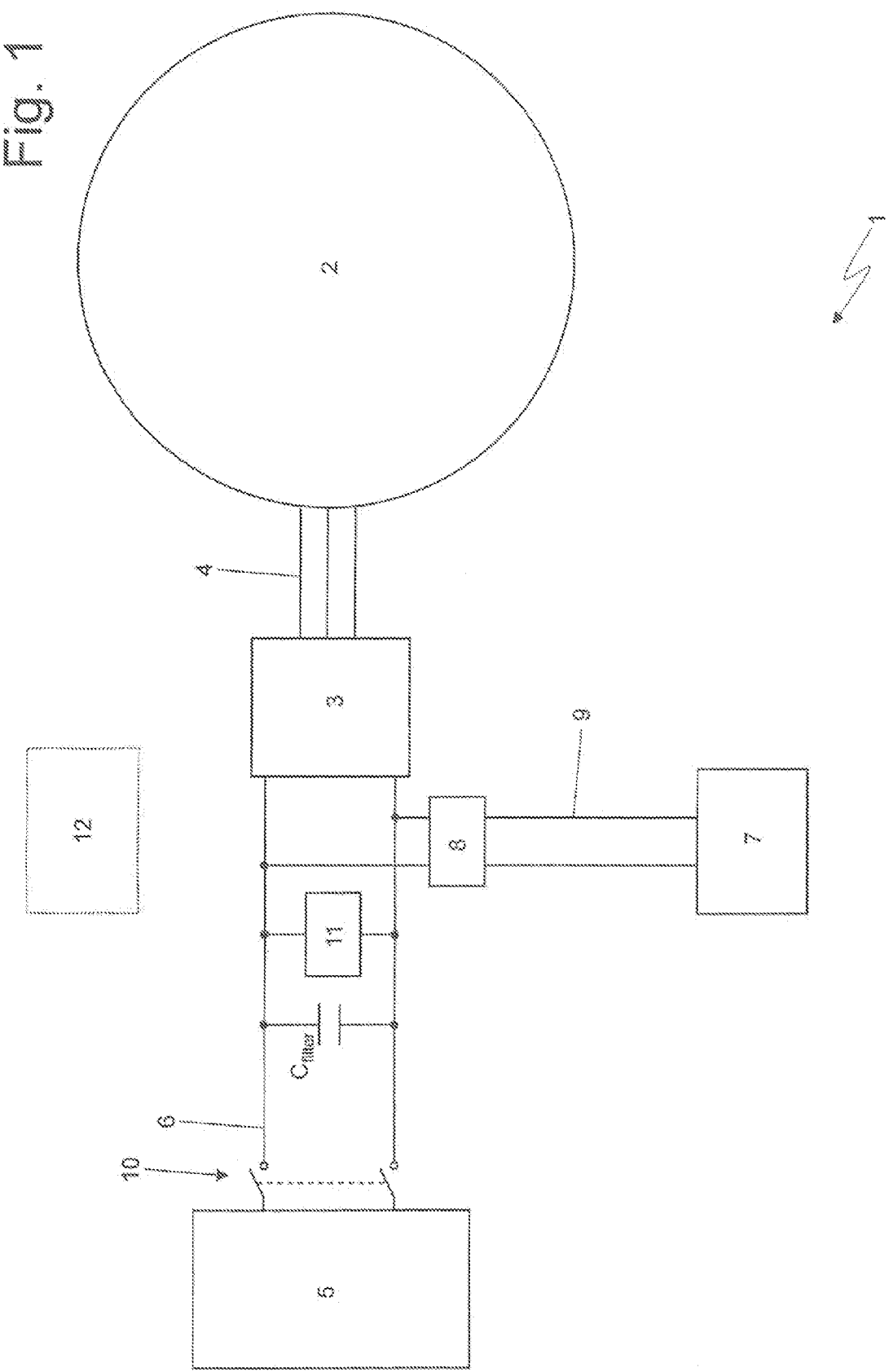
FIG. 1 is a diagrammatical view of an electric-power system of an electric-drive vehicle provided with a discharge device made according to an embodiment of the invention.

In FIG. 1, an electric-power system of a hybrid thermal-/electric-drive vehicle is generally indicated at 1. The electric-power system 1 comprises a three-phase (typically, synchronous and of the "permanent magnet" type), reversible electrical machine 2 (i.e., that may work either as an electric motor by drawing electricity and generating mechanical drive torque or electric generator by drawing mechanical energy and generating electricity) that is mechanically connected or connectable to the drive wheels of the vehicle.

The electric-power system 1 comprises an electronic power converter 3 that is electrically connected to the electric machine 2 by three cables 4 and controls the electric machine 2 and high-voltage storage system 5 (typically, 400-600 volts) that is adapted to store electricity, consists of a pack of lithium batteries (provided with respective electrochemical cells), and is electrically connected to the electronic power converter 3 by a pair of cables 6. The high-voltage storage system 5 has the function of storing/releasing large amounts of energy that are exchanged with the electric machine 2 when electrically driving the vehicle.

The electric-power system 1 comprises a low-voltage storage system 7 (typically, 12 volts) that is adapted to store electricity and generally consists of a single lead battery. The low-voltage storage system is intended to store a small amount of electricity that is used to supply the auxiliary services of the vehicle working at low voltage. The electric-power system 1 comprises an electronic "DC/DC" converter 8 that is connected to the low-voltage storage system 7 by a pair of cables 9 to supply energy, when needed, to the low-voltage storage system 7, thus keeping it charged over time. In other words, the electronic "DC/DC" converter 8 takes high-voltage electricity from the high-voltage storage system 5 and transfers low-voltage electricity to the low-voltage system 7. The electronic "DC/DC" converter 8 could also be of the "two-way" type to transfer or take electricity to/from the low-voltage storage system 7.

The high-voltage storage system 5 is provided with an isolating switch 10 that, when necessary (e.g., in case of maintenance intervention or accidents), is automatically opened to galvanically separate the high-voltage storage system 5 from the rest of the electric system 1.

The electric-power system 1 comprises a filter capacitor $C_{filter}$ that is connected in parallel to the terminals of the high-voltage storage system 5 immediately downstream of the isolating switch 10 (i.e., interposed between the high-voltage storage system 5 and all the other electric apparatuses) and has a high capacitance and the function of absorbing/supplying high-frequency electricity. In other words, the high-voltage storage system 5 supplies/absorbs the "average value" of the exchanged electricity while the filter capacitor $C_{filter}$ supplies/absorbs the pulse variations of the exchanged electricity (thereby, the life of the electrochemical cells of the high-voltage storage system 5, which rapidly decay when they must exchange impulsive energy, is extended).

The electric-power system 1 comprises a discharge device 11 that is arranged close to the filter capacitor $C_{filter}$ and connected in parallel to the filter capacitor $C_{filter}$ and has the function of discharging the titter capacitor $C_{filter}$ [i.e., rapidly lowering the residual voltage of the Hirer capacitor $C_{filter}$ to non-dangerous values (typically, lower than 50-60 volts)] whenever the isolating switch 10 of the high-voltage storage system 5 is opened.

The electric-power system 1 comprises a control unit 12 (typically, provided with a microprocessor) that supervises the operation of the whole electric-power system 1 and, inter alia, controls the isolating switch 10 of the high-voltage storage system 5 to open the isolating switch 10 itself when necessary (and, accordingly, controls the discharge device 11 to discharge the filter capacitor $C_{filter}$ whenever the isolating switch 10 is opened).

Figure 2:
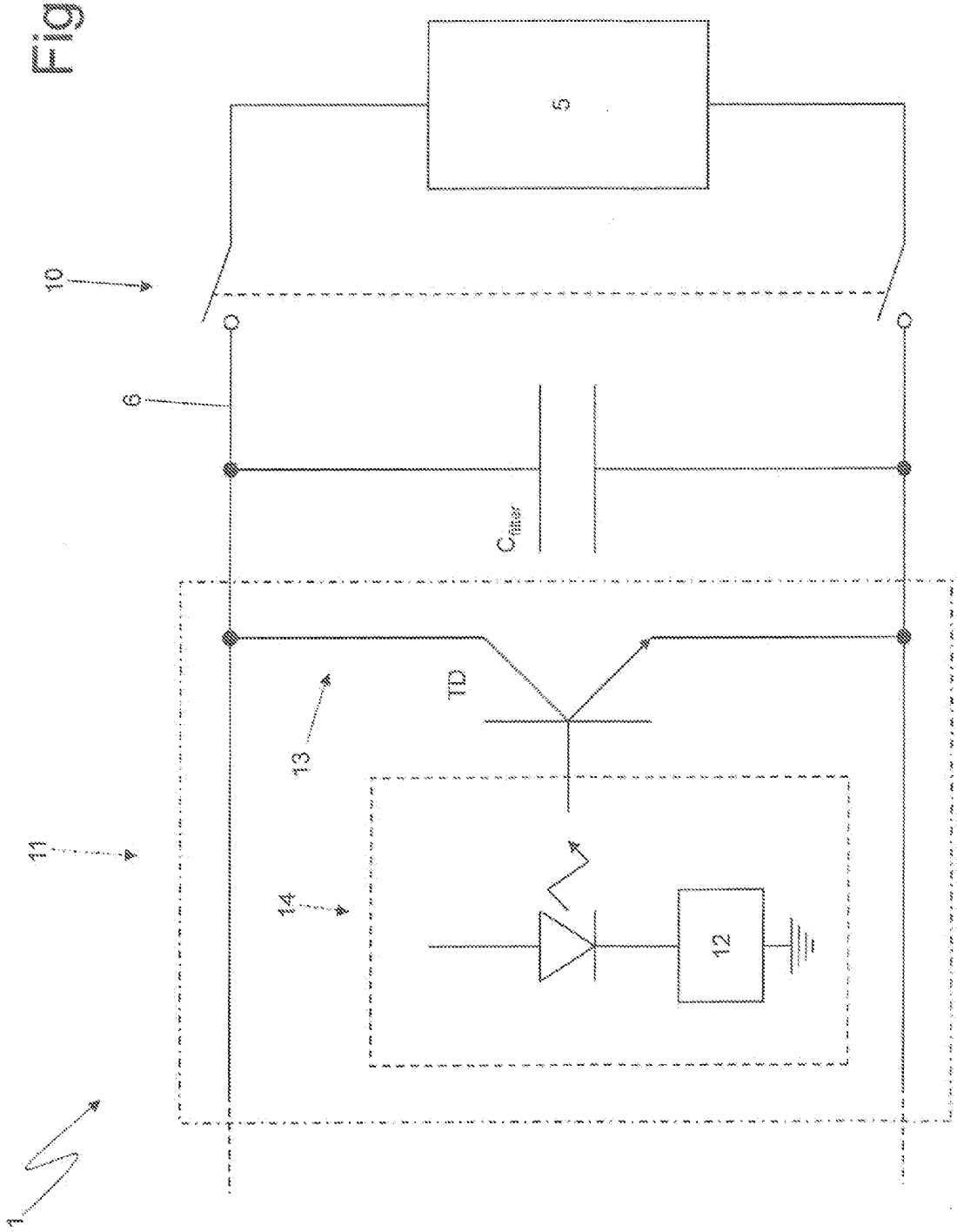
FIG. 2 is an approximate electric scheme of the embodiment of the discharge device illustrated in FIG. 1.

As shown in FIG. 2, the discharge device 11 comprises a discharge branch 13 that is connected in parallel to the filter capacitor $C_{filter}$ and provided with a discharge transistor TD that is biased to "conduction" mode when discharging the filter capacitor $C_{filter}$ is required. In other words, the discharge transistor TD is arranged in series along the discharge branch 13 and, thus, works as a switch that opens and closes the discharge branch 13. When the discharge transistor TD is biased to "conduction" mode, there is electric continuity along the discharge branch 13, and, therefore, the energy contained in the filter capacitor $C_{filter}$ may be dissipated through the discharge branch 13. When, instead, the discharge transistor TD is isolated, there is no electric continuity along the discharge branch 13, and, thus, the energy contained in the filter capacitor $C_{filter}$ cannot be dissipated through the discharge branch 13. A dissipation resistor $R_e$ that is arranged in series to the discharge transistor TD is also present in the discharge branch 13 (in particular, connected between the emitter of the discharge transistor TD and electric ground of the high-voltage circuit). The energy of the filter capacitor $C_{filter}$ can be dissipated mainly on the discharge transistor TD, dissipation resistor $R_e$, or both in any proportion by varying the size of the components.

The discharge device 11 comprises a control device 14 that is connected to the "gate/base" terminal of the discharge transistor TD and controls the discharge transistor TD by biasing the discharge transistor TD to "conduction" mode when discharging the filter capacitor $C_{filter}$ is required. In other words, the control device 14 normally connects the "gate/base" terminal of the discharge transistor TD to the electric ground of the high-voltage circuit to maintain the discharge transistor TD isolated (and, thus, discharge branch 13 open). The control device 14 connects the "gate/base" terminal of the discharge transistor TD at a supply voltage (in an embodiment, a positive terminal of the filter capacitor $C_{filter}$) to bias the transistor TD to "conduction" mode and, thus, close the discharge branch 13 when discharging the filter capacitor $C_{filter}$ is required.

Figure 3:
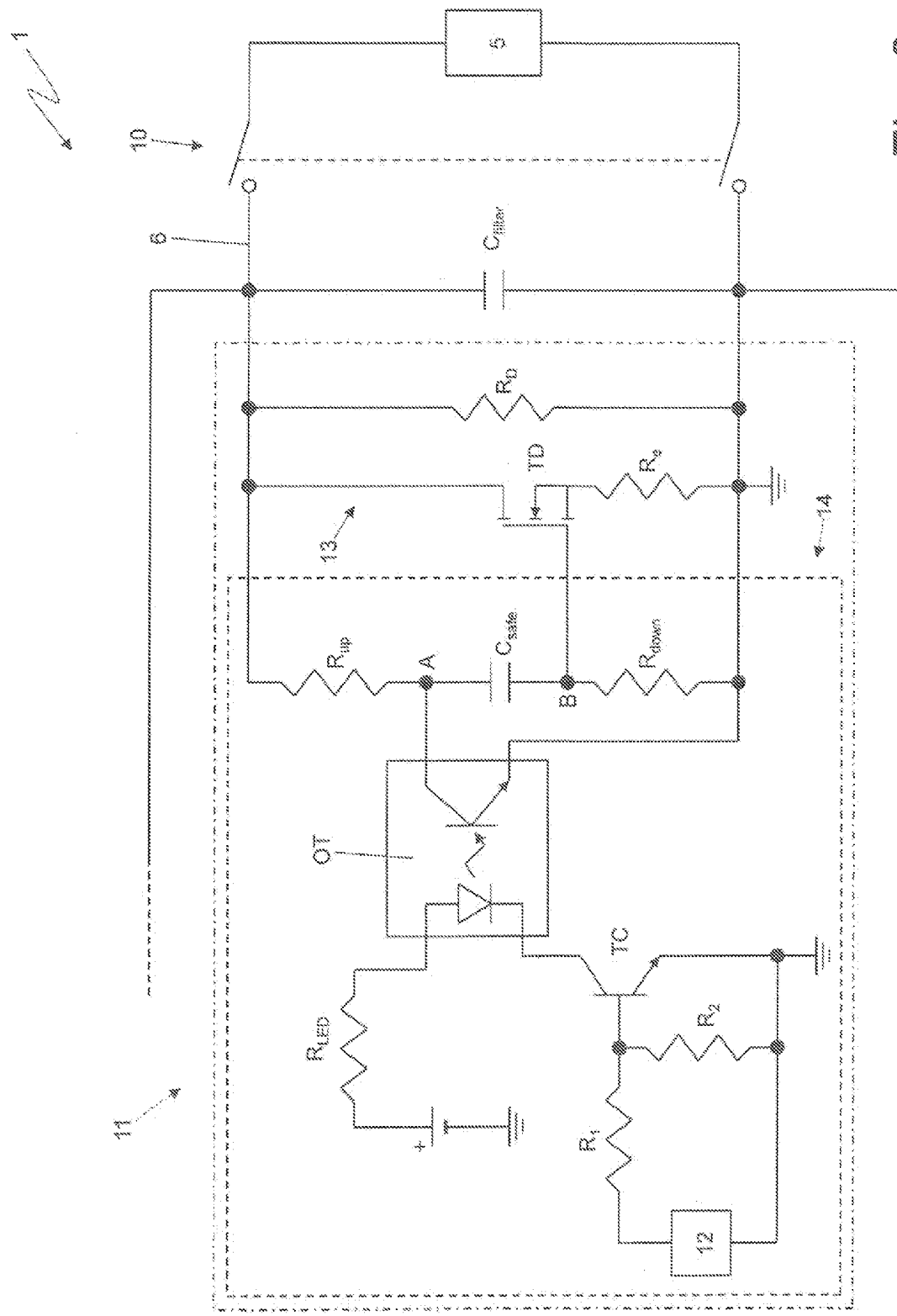
FIG. 3 is a detailed electric scheme of the embodiment of the discharge device illustrated in FIG. 1.

As shown in FIG. 3, the control device 14 comprises a control transistor TC that is controlled by the control unit 12 and must be isolated (i.e., "off" or in a "non-conductive" state) to allow the discharge transistor TD to conduct. In other words, the control transistor TC is connected to the "gate/base" terminal of the discharge transistor TD so that the discharge transistor TD is biased to "conduction" mode only when the control transistor TC is isolated. In particular, an output of the control unit 12 is connected to the "gate/base" terminal of the control transistor TC by a voltage divider consisting of two connecting resistors $R_1$ and $R_2$. Thereby, the control transistor TC is controlled by the control unit 12 that normally maintains the control transistor TC in a "conducting" state and biases the control transistor TC from the "conducting" state to the "isolated" state when discharging the filter capacitor $C_{filter}$ is required.

According to an embodiment, a phototransistor OT—that ensures the galvanic insulation between the low-voltage branch (typically, 5 volts) (in which the control unit 12 and control transistor TC are located) and high-voltage branch (in which the discharge transistor TD and filter capacitor $C_{filter}$ are located)—is interposed between the control transistor TC and discharge transistor TD. In other words, the control device 14 comprises a photo-transistor OT that is connected between the discharge transistor TD and control transistor TC to provide a galvanic insulation. A control photodiode of the phototransistor OT is connected in series to the control transistor TC (in particular, an anode of the control photodiode is connected to a supply voltage by a polarization resistor $R_{LED}$) while a cathode of the control photodiode is connected to a collector of the control transistor TC (the emitter of the control transistor TC is connected to the electric ground of the low-voltage circuit and galvanically isolated from the electric ground of the high-voltage circuit).

The "gate/base" terminal of the discharge transistor TD is connected to the positive terminal of the filter capacitor $C_{filter}$ by a connecting resistor $R_{up}$ and electric ground of the high-voltage circuit by a connecting resistor $R_{down}$. The two connecting resistors $R_{up}$ and $R_{down}$ define a voltage divider that applies a fraction of the overall voltage of the filter condenser $C_{filter}$ to the "gate/base" terminal of the discharge transistor TD.

The control device 14 (i.e., phototransistor OT) connects the "gate/base" terminal of the discharge transistor TD to the electric ground of the high-voltage circuit when the control transistor TC is biased to "conduction" mode. Thereby, when the control transistor TC is biased to "conduction" mode, the "gate/base" terminal of the discharge transistor TD is equipotential with the electric ground of the high-voltage circuit. Thus, the discharge transistor TD is mandatorily isolated.

According to a an embodiment, the control unit 14 comprises a safety capacitor $C_{safe}$ that is interposed between the "gate/base" terminal of the discharge transistor TD and positive terminal of the biter capacitor $C_{filter}$. In particular, the safety capacitor $C_{safe}$ is connected in series to the connecting resistor $R_{up}$ and arranged downstream of the connecting resistor $R_{up}$ with respect to the "gate/base" terminal of the discharge transistor TD. Furthermore, the safety capacitor $C_{safe}$ is also interposed between the "gate/base" terminal of the discharge transistor TD and control device 14 (i.e., phototransistor OT). The emitter of the phototransistor OT is directly connected to the electric ground of the high-voltage circuit while the collector of the photo transistor OT is connected to a point "A" arranged between the connecting resistor $R_{up}$ and safety capacitor $C_{safe}$ (i.e., a first terminal of the control device 14 is connected between the connecting resistor $R_{up}$ and safety capacitor $C_{safe}$ and a second terminal of the control device 14 is connected to the electric ground of the high-voltage circuit). Moreover, the "gate/base" terminal of the discharge transistor TD is directly connected to a point "B" arranged between the safety capacitor $C_{safe}$ and connecting resistor $R_{down}$.

As explained in greater detail below, the safety capacitor $C_{safe}$ is charged when the discharge transistor TD is in the "conductive" state, thus determining a progressive reduction of the voltage/current at the "gate/base" terminal of the discharge transistor TD until the discharge transistor TD is taken to the "isolated" state after a certain period of time from the starting instant of charging the safety capacitor $C_{safe}$ (i.e., the conduction of the discharge transistor TD).

According to an embodiment, the discharge device 11 also comprises a discharge resistor $R_D$ that is permanently connected in parallel to the filter capacitor $C_{filter}$ to determine a passive discharge of the filter capacitor $C_{filter}$. The function of the discharge resistor $R_D$ is essentially of (extreme) emergency [i.e., the discharge resistor allows to discharge (very slowly) the filter capacitor $C_{filter}$ also when the discharge device 11 is completely out of order].

The operation of the discharge device 11 is described below with reference to FIG. 3 and time charts in FIG. 4. In normal operating conditions (including, in FIG. 4, between time instant $T_0$ and time instant $T_1$), the control transistor TC is in the "conductive" state ("ON"). Thus, an electric current flows through the control photodiode of the phototransistor OT (that is connected in series to the control transistor TC). Therefore, the phototransistor OT is in the "conductive" state as well. As the phototransistor OT is in the "conductive" state, point "A" is connected to the electric ground of the high-voltage circuit (through the phototransistor OT in the "conductive" state). Thus, the voltage $V_{A-B}$ at the terminals of the safety capacitor $C_{safe}$ is zero (as point "A" is connected to the electric ground of the high-voltage circuit), and the voltage $V_{B-GND}$ of the "gate/base" terminal of the discharge transistor TD is also zero (as point "A" is connected to the electric ground of the high-voltage circuit). When the voltage $V_{B-GND}$ of the "gate/base" terminal of the discharge transistor TD is zero, the discharge transistor TD is necessarily isolated ("OFF"). Thus, the discharge branch 13 is open.

The isolating switch 10 is opened just before time instant $T_1$, and, therefore, rapidly discharging the filter capacitor $C_{filter}$ is required. Accordingly, in time instant $T_1$, the control unit 12 cancels the signal from the "gate/base" terminal of the control transistor TC, thus biasing the control transistor TC itself to "non-conductive" state ("OFF"). In time instant $T_1$, the current across the control photodiode of the phototransistor OT is cancelled (due to the opening of the control transistor TC), and the phototransistor OT stops conducting. Therefore, point "A" is isolated from the electric ground of the high-voltage circuit. In time instant $T_1$, point "A" is isolated from the electric ground of the high-voltage circuit, and, thus, point "B" (i.e., the "gate/base" terminal of the discharge transistor TD) is at a maximum voltage $V_{MAX}$ (the value of which depends on the "reduction" ratio of the voltage divider formed by the two connection resistors $R_{up}$ and $R_{down}$) while the safety capacitor $C_{safe}$ starts charging (i.e., the voltage $V_{A-B}$ at the terminals of the safety capacitor $C_{safe}$ starts rising).

Due to the progressive charging of the safety capacitor $C_{safe}$, the voltage $V_{A-B}$ at the terminals of the safety capacitor $C_{safe}$ exponentially increases, and the voltage $V_{B-GND}$ at the "gate/base" terminal of the discharge transistor TD decreases in a complementary manner. Between time instant $T_1$ and time instant $T_2$, the voltage $V_{B-GND}$ at the "gate/base" terminal of the transistor TD decreases progressively and exponentially between the maximum voltage $V_{MAX}$ and a minimum voltage $V_{min}$ that are, however, sufficient to maintain the discharge transistor TD in the "conductive" state. After time instant $T_2$, the voltage $V_{B-GND}$ at the "gate/base" terminal of the discharge transistor TD drops under the minimum voltage $V_{min}$, and, thus, the discharge transistor TD stops conducting and returns to the isolated condition ("OFF"). In other words, in time instant $T_2$, the voltage $V_{A-B}$ at the terminals of the safety capacitor $C_{safe}$ reaches a threshold voltage $V_{TH}$ such that the voltage $V_{B-GND}$ at the "gate/base" terminal of the discharge transistor TD is equal to the minimum voltage $V_{min}$ under which the discharge transistor TD stops conducting and returns to the isolated condition ("OFF").

The safety capacitor $C_{safe}$ serves the function of a "timer" that "automatically" turns off the discharge transistor TD after a given interval of time (of the order of a few seconds) from activation of the discharge transistor TD itself (i.e., once the discharge transistor TD is biased to "conduction" mode, it keeps conducting for a given time interval at the end of which the effect of the safety capacitor $C_{safe}$ determines an "automatic" switch-off of the discharge transistor TD). This function of the safety capacitor $C_{safe}$ is very important because it allows to protect the discharge branch 13 (in particular, discharge transistor TD) from overheating when the discharge transistor TD is activated without the isolating switch 10 having been opened. In other words, a fault could bias the discharge transistor TD to "conduction" mode without the isolating switch 10 being opened. In this case, all the energy of the high-voltage storage system 5, which is very much higher than the energy stored in the filter capacitor $C_{filter}$, is discharged into the discharge branch 13 and, thus, rapidly determines the melting of the discharge transistor TD and/or dissipation resistor $R_e$. Instead, by virtue of the action of the safety capacitor $C_{safe}$, the discharge transistor TD opens in all cases after a given time interval. It, thus, prevents energy higher than the actual dissipation capacities from being dissipated in the discharge branch 13.

According to an embodiment, when discharging the filter capacitor $C_{filter}$ is required, the active control unit 12 activates the electronic "DC/DC" converter 8 that is connected in parallel to the filter capacitor $C_{filter}$ and supplies the low-voltage storage system 7 to transfer the energy from the filter capacitor $C_{filter}$ to the low-voltage storage system 7. Furthermore, when discharging the filter capacitor $C_{filter}$ is required, the control unit 12 activates the electronic power converter 3 that is connected in parallel to the filter capacitor $C_{filter}$ and controls the electric machine 2 to allow a current to circulate through the electric machine 2 [which does not determine generation or absorption of drive torque (but determines a certain power dissipation by "Joule effect" in the windings of the electric machine 2 and inside the electronic power converter 3)]. The energy that is absorbed by the electronic "DC/DC" converter 8 and electronic power converter 3, working in parallel with (i.e., in addition to) the discharge branch 13, allows to substantially accelerate the discharge of the filter capacitor $C_{filter}$. Thereby, the filter capacitor $C_{filter}$ can be discharged (i.e., the voltage at the terminals of the filter capacitor $C_{filter}$ can be lowered to non-dangerous values) very rapidly (in less than one second) despite using a relatively small discharge transistor TD (i.e., not provided with a high heat-dissipation capacity). In other words, the intervention of the electronic "DC/DC" converter 8 and electronic power converter 3 helps to discharge the filter condenser $C_{filter}$, and, therefore, a less-performing discharge transistor TD (thus, smaller and less costly) can be used while maintaining a very low discharge time of the filter capacitor $C_{filter}$.

The discharge device 11 is very safe per se because no control activation is required (i.e., turning on the control transistor TC) to activate the discharge of the filter capacitor $C_{filter}$, but cancellation of a control is required (i.e., turning off the control transistor TC). Thus, in the case of fault of the control unit 12 (e.g., when the microprocessor of the control unit 12 is reset in case of mechanical failure in the connection between the control unit 12 and control transistor TC or interruption of the power voltage of the control transistor TC), the discharge transistor TD automatically closes (i.e., is automatically biased to "conduction" mode), thus allowing to discharge the biter capacitor $C_{filter}$. In case of fault, the intervention of the electronic "DC/DC" converter 8 and electronic power converter 3 is not realistic to help (speed up) the discharge of the filter capacitor $C_{filter}$, but the only consequence is a loss of efficiency (i.e., the discharge of the filter capacitor $C_{filter}$ takes longer) . . . and not a loss of effectiveness [i.e., the filter capacitor $C_{filter}$ is, however, discharged, albeit over a longer time (of the order of a few seconds instead of less than one second)].

The basic idea is to provide a control device 14 with "reverse" operation. Indeed, the discharge of the filter capacitor $C_{filter}$ is not generated following an activation control. But, on the contrary, the discharge of the filter capacitor $C_{filter}$ is constantly deactivated by generating a deactivation control. When such a deactivation control ceases (due to a choice by the control unit 12 or following a fault), the discharge of the filter capacitor $C_{filter}$ is automatically activated. Moreover, the energy needed to maintain the discharge transistor TD in the "conduction" mode comes directly from the filter capacitor $C_{filter}$. Therefore, once the discharge has been trigged by the discharge branch 13, the discharge itself is "self-sustained" until the residual voltage at the terminals of the filter capacitor $C_{filter}$ drops to very low (i.e., not dangerous) values.

By activating the control transistor TC for a short time, the control unit 12 can repeat the discharge sequence (between time instants $T_0$ and $T_2$) for an unlimited number of times if the discharge of the filter capacitor $C_{filter}$ is not (completely) effective "the first time around." In other words, the control unit 12 is capable of carrying out a series of discharge sequences (called "multiple active discharge") to discharge the filter capacitor $C_{filter}$ in several steps. For example, the multiple active discharge may be used when the isolating switch 10 is jammed in a closed configuration, has an intermittent operation, or opens with an anomalous delay (of the order of a few seconds). The multiple active discharge allows to ensure the attempt to discharge the filter capacitor $C_{filter}$ over time [even in case of malfunctions (e.g., of the insulating switch 10)] while avoiding failures caused by overheating in the discharge branch 13.

By way of example, a bipolar-junction transistor (BJT) has a collector, a "gate/base" terminal, and an emitter. In a substantially equivalent embodiment, a field-effect transistor (typically, with "MOSFET" technology) having a drain, gate, and source can be used.

The discharge device 11 is simple and cost-effective to be implemented because it consists of a few elements that are easily available and cost-effective. Furthermore, the discharge device 11 ensures the possibility of ("automatically") activating the discharge of the filter capacitor $C_{filter}$ even in the presence of faults in the control unit 12 (e.g., due to lack of supply voltage or micro-controller reset) or electric system 1 (e.g., detachment of a connector or breakage of a fuse) and case of total disconnection of the low-voltage storage system 7 (in which condition ail the electronic-control units on the vehicle cease working and are switched off). Thereby, the discharge device 11 greatly simplifies formal safety analyses required in automotive applications because a "reverse analysis" method can be carried out instead of analyzing the reaction of the discharge device 11 in the presence of all possible faults. That is, the discharge that is automatically generated in the presence of faults is deactivated as long as the discharge device 11 is intact. In other words, the discharge device 11 is very robust even in case of multiple faults. The discharge device 11 has an "intrinsic" thermal protection [i.e., not bound to the intervention of external elements, but directly determined by the passive components (in particular, safety capacitor $C_{safe}$)] because the amount of electricity that may be dissipated in the discharge branch 13 at each single activation of the discharge branch 13 itself is automatically limited.

It should be appreciated by those having ordinary skill in the related art that the discharge device 11 and method have been described above in an illustrative manner. It should be so appreciated also that the terminology that has been used above is intended to be in the nature of words of description rather than of limitation. It should be so appreciated also that many modifications and variations of the discharge device 11 and method are possible in light of the above teachings. It should be so appreciated also that, within the scope of the appended claims, the discharge device 11 and method may be practiced other than as specifically described above.

What is claimed is:

1. A discharge device for active discharge of a main capacitor in an electric-power system of an electric-drive vehicle, the discharge device comprising:
   a discharge branch of a circuit that is connected in parallel to the main capacitor and includes a discharge transistor that is biased to conduction mode when the main capacitor is required to be discharged; and
   a control device that is connected to a gate/base terminal of the discharge transistor and commands the discharge transistor, biasing the discharge transistor to conduction mode when the main capacitor is required to be discharged;
   wherein the control device includes a safety capacitor that is directly connected to the gate/base terminal and to a power supply and charges when the discharge transistor is in the conduction mode, causing a progressive decrease of current at the gate/base terminal, until the discharge transistor is biased to the non-conductive state a given interval of time after the discharge transistor has begun to conduct the current, so that the safety capacitor serves the function of a timer that turns off the discharge transistor after the given interval of time from activation of the discharge transistor.

2. A discharge device as set forth in claim 1, wherein the safety capacitor is connected across the gate/base terminal and a positive terminal of the main capacitor.

3. A discharge device as set forth in claim 1, wherein the safety capacitor is connected to a positive terminal of the main capacitor through a first connecting resistor.

4. A discharge device as set forth in claim 3, wherein the gate/base terminal is connected to electric ground of a high-voltage circuit through a second connecting resistor that, together with the first resistor, defines a voltage divider.

5. A discharge device as set forth in claim 4, wherein one of the terminals of the control device is connected across the first connecting resistor and safety capacitor and another terminal of the control device is connected to the electric ground of the high-voltage circuit.

6. A discharge device as set forth in claim 1, wherein, when the main capacitor is required to be discharged, a control unit activates an electronic DC/DC converter that is connected in parallel to the main capacitor and provides power to a low-voltage energy-storage system to transfer energy from the main capacitor to the low-voltage energy-storage system.

7. A discharge device as set forth in claim 1, wherein, when the main capacitor is required to be discharged, a control unit activates an electronic high-voltage power converter that is connected in parallel to the main capacitor and drives an electric machine to circulate through the electric machine the current that causes neither of generation and absorption of torque.

8. A discharge method for active discharge of a main capacitor in an electric-power system of an electric-drive vehicle, the method comprising steps of:
   biasing, when the main capacitor is required to be discharged, a discharge transistor to conduction mode to create a discharge branch in a circuit through which energy accumulated in the main capacitor is discharged; and
   charging, when the discharge transistor is in the conduction mode, a safety capacitor that is directly connected to a gate/base terminal of the discharge transistor and to a power supply to cause a progressive decrease of current at the gate/base terminal until the discharge transistor is biased to a non-conductive state a given interval of time after the discharge transistor has begun to conduct the current, so that the safety capacitor serves the function of a timer that turns off the discharge transistor after the given interval of time from activation of the discharge transistor.

* * * * *